(12) United States Patent
Raisanen et al.

(10) Patent No.: US 11,926,895 B2
(45) Date of Patent: *Mar. 12, 2024

(54) STRUCTURES INCLUDING METAL CARBIDE MATERIAL, DEVICES INCLUDING THE STRUCTURES, AND METHODS OF FORMING SAME

(71) Applicant: ASM IP Holding B.V., Almere (NL)

(72) Inventors: Petri Raisanen, Gilbert, AZ (US); Michael Givens, Scottsdale, AZ (US); Eric James Shero, Phoenix, AZ (US)

(73) Assignee: ASM IP Holding B.V., Almere (NL)

( * ) Notice: Subject to any disclaimer, the term of this patent is extended or adjusted under 35 U.S.C. 154(b) by 60 days.

This patent is subject to a terminal disclaimer.

(21) Appl. No.: 17/583,371

(22) Filed: Jan. 25, 2022

(65) Prior Publication Data

US 2022/0149175 A1    May 12, 2022

Related U.S. Application Data

(60) Continuation of application No. 16/563,473, filed on Sep. 6, 2019, now Pat. No. 11,242,598, which is a division of application No. 14/752,712, filed on Jun. 26, 2015, now Pat. No. 10,458,018.

(51) Int. Cl.
| | | |
|---|---|---|
| *C23C 16/455* | (2006.01) | |
| *C23C 16/32* | (2006.01) | |
| *H01L 21/28* | (2006.01) | |
| *H01L 29/49* | (2006.01) | |

(52) U.S. Cl.
CPC ........ *C23C 16/45525* (2013.01); *C23C 16/32* (2013.01); *H01L 21/28088* (2013.01); *H01L 29/49* (2013.01); *H01L 29/4966* (2013.01)

(58) Field of Classification Search
CPC .............. C23C 16/45525; C23C 16/32; H01L 21/28088; H01L 29/49; H01L 29/4966; H01L 29/517; H01L 21/02172; H01L 21/02205; H01L 21/32056; H01L 29/152
See application file for complete search history.

(56) References Cited

U.S. PATENT DOCUMENTS

| | | |
|---|---|---|
| 2007/0231487 A1 | 10/2007 | Ishizaka |
| 2008/0121962 A1 | 5/2008 | Forbes |

(Continued)

FOREIGN PATENT DOCUMENTS

| | | |
|---|---|---|
| WO | 2009129332 A2 | 10/2009 |
| WO | 2012167141 A2 | 6/2012 |

OTHER PUBLICATIONS

KIPO; Notice of Ground for Rejection In Korea dated Jul. 26, 2022 in Application No. 10-2016-0078153.

(Continued)

*Primary Examiner* — Andrew J. Oyer
(74) *Attorney, Agent, or Firm* — Snell & Wilmer L.L.P.

(57) ABSTRACT

Methods of forming thin-film structures including metal carbide material, and structures and devices including the metal carbide material are disclosed. Exemplary structures include metal carbide material formed using two or more different processes (e.g., two or more different precursors), which enables tuning of various metal carbide material properties, including resistivity, current leakage, and work function.

13 Claims, 5 Drawing Sheets

(56) References Cited

U.S. PATENT DOCUMENTS

| | | | |
|---|---|---|---|
| 2009/0315093 A1* | 12/2009 | Li | H01L 21/28088 438/584 |
| 2010/0193955 A1 | 8/2010 | Milligan | |
| 2014/0273510 A1 | 9/2014 | Chen et al. | |
| 2015/0262828 A1* | 9/2015 | Brand | H01L 29/7833 438/592 |
| 2016/0376704 A1 | 12/2016 | Raisanen | |
| 2019/0348515 A1 | 11/2019 | Li et al. | |

OTHER PUBLICATIONS

KIPO; Notice of Ground for Rejection In Korea dated Jan. 30, 2023 in Application No. 10-2016-0078153.
USPTO; Non-Final Office Action dated Aug. 19, 2020 in U.S. Appl. No. 16/400,814.
USPTO; Final Office Action dated Dec. 14, 2020 in U.S. Appl. No. 16/400,814.
USPTO; Advisory Action dated Feb. 15, 2018 in U.S. Appl. No. 14/752,712.
USPTO; Final Office Action dated Nov. 29, 2017 in U.S. Appl. No. 14/752,712.
USPTO; Final Office Action dated Sep. 5, 2018 in U.S. Appl. No. 14/752,712.
USPTO; Non-Final Office Action dated Aug. 3, 2017 in U.S. Appl. No. 14/752,712.
USPTO; Non-Final Office Action dated Mar. 21, 2018 in U.S. Appl. No. 14/752,712.
USPTO; Non-Final Office Action dated Dec. 28, 2018 in U.S. Appl. No. 14/752,712.
USPTO; Notice of Allowance dated Jun. 11, 2019 in U.S. Appl. No. 14/752,712.
USPTO; Ex Parte Quayle Action dated Aug. 6, 2021 in U.S. Appl. No. 16/563,473.
USPTO; Non-Final Office Action dated Feb. 1, 2021 in U.S. Appl. No. 16/563,473.
USPTO; Notice of Allowance dated Sep. 30, 2021 in U.S. Appl. No. 16/563,473.
USPTO; Restriction Requirement dated Apr. 22, 2020 in U.S. Appl. No. 16/400,814.
USPTO; Restriction Requirement dated Jul. 5, 2017 in U.S. Appl. No. 14/752,712.

* cited by examiner

STRUCTURES INCLUDING METAL CARBIDE MATERIAL, DEVICES INCLUDING THE STRUCTURES, AND METHODS OF FORMING SAME

CROSS-REFERENCE TO RELATED APPLICATIONS

This application is a continuation of, and claims priority to and the benefit of, U.S. patent application Ser. No. 16/563,473, filed Sep. 6, 2019 and entitled "STRUCTURES INCLUDING METAL CARBIDE MATERIAL, DEVICES INCLUDING THE STRUCTURES, AND METHODS OF FORMING SAME," which is a divisional of, and claims priority to and the benefit of, U.S. Ser. No. 14/752,712 filed Jun. 26, 2015 and entitled "STRUCTURES INCLUDING METAL CARBIDE MATERIAL, DEVICES INCLUDING THE STRUCTURES, AND METHODS OF FORMING SAME," now U.S. Pat. No. 10,458,018 issued on Oct. 29, 2019, all of which are hereby incorporated by reference herein.

FIELD OF THE INVENTION

The present disclosure generally relates to techniques for forming structures including metal carbide material and to structures and devices including the metal carbide material. Exemplary structures include metal carbide material formed using two or more different processes.

BACKGROUND OF THE DISCLOSURE

Field-effect transistor (FET) devices, such as metal-oxide-semiconductor FET (MOSFET) devices generally include a source region, a drain region, a channel region between the source and drain regions, and a gate electrode overlying the channel region and separated from the channel region by a dielectric material. A complimentary MOSFET (CMOS) device includes a p-type MOSFET device and an n-type MOSFET device. To operate as desired, a work function of the gate electrode of the n-type device and of the p-type device must differ by a certain amount. The difference in the work function is generally obtained by "tuning" the gate electrode material.

Traditionally, MOSFET devices are formed using silicon oxide as the dielectric material and polysilicon as the gate electrode material. Polysilicon has worked relatively well as a gate electrode material, because it allows relatively easy tuning of a work function of the devices and consequently a threshold voltage of the devices.

As MOSFET devices are scaled down to meet desired performance criteria, metal has generally replaced polysilicon as a gate electrode material and high dielectric constant material has generally replaced silicon oxide as the dielectric material for high performance devices. However, by replacing polysilicon with metal, a work function difference between the gate and the channel becomes more difficult to tune. As a result, modification of a threshold voltage of the devices becomes more difficult.

To facilitate work function tuning of MOSFET devices including a metal gate electrode, gate structures can include an additional metal layer, i.e., a work function layer, such as a metal carbide, to tune the work function and consequently the threshold voltage of the devices. Generally, the work-function layers are relatively less conductive than gate electrode metal, which can result in a loss of desired performance of the devices. Attempts to increase the conductivity of the work-function layers generally results in lower work function of the devices.

Accordingly, improved methods of forming metal carbide materials and improved structures and devices including such materials are desired.

SUMMARY OF THE DISCLOSURE

Various embodiments of the present disclosure relate to methods of forming structures and devices including metal carbide material and to structures and devices including metal carbide material. While the ways in which exemplary embodiments of the disclosure address various drawbacks of prior methods, structures, and devices are discussed in more detail below, in general, various embodiments of the disclosure provide methods of forming structures and devices with metal carbide material, wherein device properties can be tuned by adjusting a composition of the metal carbide material. As set forth in more detail below, the metal carbide material can include discrete layers or a mixture of metal carbide layers deposited onto a surface using two or more processes. The two or more processes can use, for example, at least one different precursor, to adjust the composition or properties of the metal carbide layer.

In accordance with various embodiments of the disclosure, a method of forming a thin-film structure includes providing a substrate, depositing a first metal carbide layer using a first precursor and a second precursor; and depositing a second metal carbide layer using a third precursor and a fourth precursor. In accordance with various aspects of these embodiments, at least one of the third precursor and the fourth precursor differs from both the first precursor and the second precursor. In other words, the first process and the second process have at least one precursor that differs from the precursors used in the other process. In accordance with further aspects, the metal carbide includes a transition metal, such as titanium, tantalum, and/or niobium. The metal carbide can also include other metals or metalloids, such as Group 13 metals or metalloids (e.g., aluminum, boron, or the like). Exemplary first and/or third precursors include a metal (e.g., transition metal) halide, such as titanium chloride. Exemplary second precursors include a first organometallic precursor, such as trimethyl aluminum (TMA), triethyl aluminum (TEA), and dimethylaluminumhydride (DMAH). Exemplary fourth precursors include a second organometallic precursor, such as tritertbutylaluminum (TTBA). Electrical properties, such as work function and resistivity, of the structure can be manipulated by adjusting an amount of the first metal carbide layer and/or the second metal carbide layer. The amount of the respective layers can be adjusted by, for example, a number of layers that are deposited, a layer composition, and/or a thickness of each layer. Structures in accordance with these embodiments can have any suitable number of first metal carbide layers, second metal carbide layers, other metal carbide layers, and other layers.

In accordance with additional embodiments of the disclosure, a method of forming a thin-film structure includes depositing a first metal carbide layer having a first composition overlying a substrate and depositing a second metal carbide layer having a second composition overlying the first metal carbide layer, wherein the first composition is different from the second composition. The composition can vary by, for example, varying an amount of a first metal, a second metal, nitrogen, and/or the carbon in the metal carbide layers. In accordance with various aspects of these embodiments, the first metal carbide layer is formed using a first precursor (e.g., a metal chloride, such as titanium or tantalum chloride) and a second precursor (e.g., an organometallic precursor, such as TMA TEA, and DMAH). In accordance with further aspects, the second metal carbide layer is formed using a third precursor (e.g., a metal chloride, such as titanium or tantalum chloride) and a fourth precursor (e.g., an organometallic precursor, such as TTBA). In accordance with further aspects, the metal carbide includes a transition metal, such as titanium, tantalum, niobium, or the like. The metal carbide can also include other metals, such as Group 13 metals (e.g., aluminum). Electrical properties of the structure can be manipulated by adjusting an amount of the first metal carbide layer and/or the second metal carbide layer. The amount of the respective layers can be adjusted by, for example, a number of layers that are deposited, a composition of a layer, and/or a thickness of each layer. Structures in accordance with these embodiments can have any suitable number of first metal carbide layers, second metal carbide layers, other metal carbide layers, and other layers.

In accordance with further embodiments of the disclosure, a first metal carbide layer and a second metal carbide layer can be deposited in any order. Electrical properties of structures including such metal carbide layers can be tuned by manipulating an order in which first and second metal carbide layers are deposited, a number of first and/or second metal carbide layers, and the like.

In accordance with yet further exemplary embodiments of the disclosure, a thin-film structure includes a substrate, a first metal carbide layer formed using a first process overlying the substrate, and a second metal carbide layer formed using a second process overlying the first metal carbide layer. Exemplary structures can include additional layers, including, but not limited to, one or more of: a dielectric layer, an etch stop layer, a barrier layer, and a metal layer. Properties of the structures can be manipulated by tuning metal carbide material including the first metal carbide layer and the second metal carbide layer.

In accordance with further exemplary embodiments, a device includes one or more structures as described herein. The devices can be configured as, for example, NMOS and/or PMOS devices to form CMOS devices.

And, in accordance with yet further exemplary embodiments of a disclosure, a device is formed using a method as described herein.

Both the foregoing summary and the following detailed description are exemplary and explanatory only and are not restrictive of the present disclosure.

BRIEF DESCRIPTION OF THE DRAWING FIGURES

A more complete understanding of exemplary embodiments of the present disclosure can be derived by referring to the detailed description and claims when considered in connection with the following illustrative figures.

Figure 1:
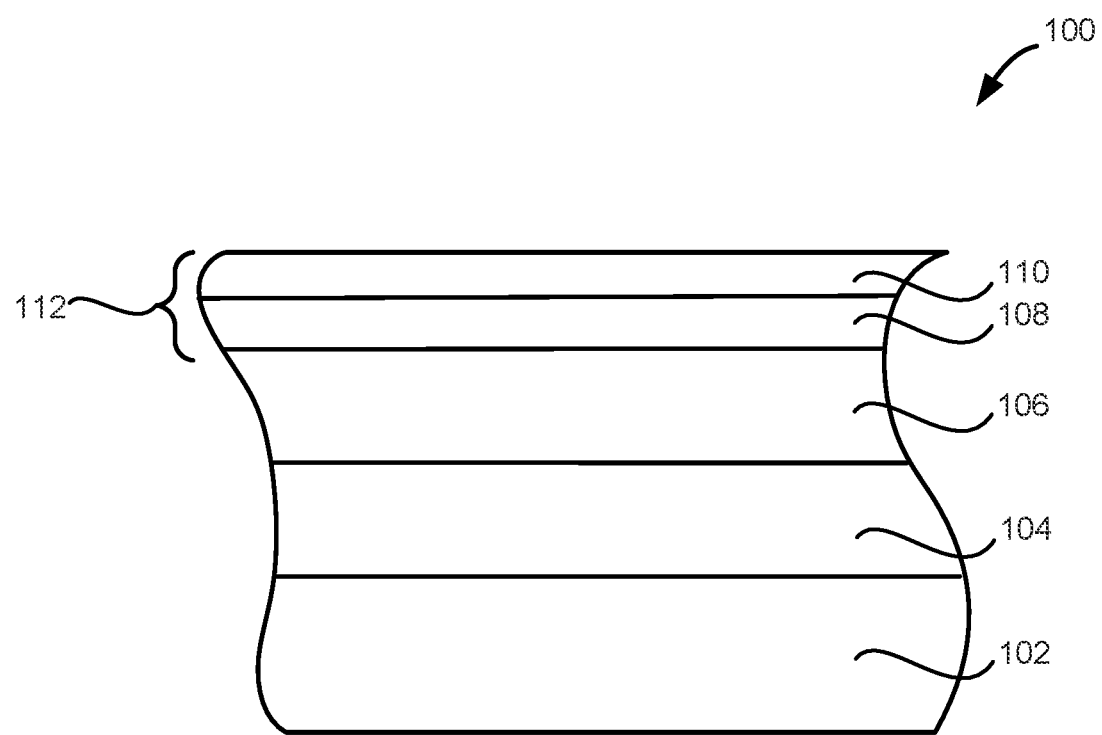
FIG. 1 illustrates a structure in accordance with exemplary embodiments of the disclosure.

It will be appreciated that elements in the figures are illustrated for simplicity and clarity and have not necessarily been drawn to scale. For example, the dimensions of some of the elements in the figures may be exaggerated relative to other elements to help to improve understanding of illustrated embodiments of the present disclosure.

DETAILED DESCRIPTION OF EXEMPLARY EMBODIMENTS OF THE DISCLOSURE

The description of exemplary embodiments of methods, systems, structures, and devices provided below is merely exemplary and is intended for purposes of illustration only; the following description is not intended to limit the scope of the disclosure or the claims. Moreover, recitation of multiple embodiments having stated features is not intended to exclude other embodiments having additional features or other embodiments incorporating different combinations of the stated features.

Exemplary embodiments of the present disclosure relate to methods of depositing metal carbide material and to structures and devices including metal carbide material. Exemplary metal carbide materials include a transition metal—e.g., a Group 4, 5, 6, 7, 8, 9, 10, 11, and/or 12 transition metal and carbon. The metal carbide material can also include one or more other metals, such as a Group 13 metal (e.g., aluminum). The metal carbide films can also include other elements, such as nitrogen, hydrogen, and the like.

Metal carbide material properties can depend on a variety of factors, including composition of the material—e.g., metals in the composition, bonding within the material, and/or percentage of each component—e.g., metal(s) and carbon present in the material, as well as the morphology of the metal carbide material. For example, in some cases, the carbon can bond with a metal, such as aluminum to form $Al_4C_3$. In these cases, the aluminum is bonded to the carbon and thus is thought to be relatively immobile. In other cases, even when the metal carbide has the same composition, the aluminum may be free and therefore able to better migrate and thus lower a resistivity of the carbide material. However, because the aluminum is relatively free, leakage current in devices including such material may be relatively high.

By way of examples, exemplary metal carbide films includes up to about 30% to about 60% carbon on an atomic basis, no or trace amounts or up to about 20% to about 25% nitrogen on an atomic basis. About 10% to about 20% transition metal (e.g., titanium) on an atomic basis, and about 10% to about 30% Group 13 metal on an atomic basis.

In some applications, it is desired that structures that include the metal carbide films have relatively low resistivity, relatively low leakage current, and a relatively low work function. With typical metal carbide materials, as the composition of the metal carbide material is manipulated to decrease resistivity in the structure, the leakage current in the structure generally increases and the work function of the structure increases. Similarly, when the composition of the metal carbide is manipulated to reduce the work function in the structure, the resistivity of the metal carbide film tends to increase.

In contrast to typical metal carbide materials, exemplary methods described herein allow formation of structures, wherein a resistivity and work function of the metal carbide material can be tuned. The resistivity and work function can be tuned by, for example, depositing layers of metal carbide material using different processes and/or at least one different precursor. In the context of this application, a "layer" or "film" can be used interchangeably and can refer to a continuous or discontinuous layer or film. Further, the layers can be discrete (e.g., form a nanolaminate) or the layers can mix together during or after deposition of a layer. The layers of metal carbide can have the same or similar elemental compositions—e.g., include substantially the same elements, but because of the different processes, bonding, and/or precursors used to form the respective films, the respective films, and therefore the overall metal carbide material can have different properties.

The methods of depositing metal carbide material can be used to form structures including metal carbide layers. The structures, in turn, can be used to form devices including the structures. As set forth in more detail below, the structures can include two or more metal carbide layers deposited in various order, at various locations, and in various combinations.

As noted above, methods described herein can be used to deposit metal carbide layers including one or more transitions metals—e.g., Group 3 to Group 12 metals—e.g., one or more metals selected from the group consisting of titanium (Ti), zirconium (Zr), hafnium (Hf), vanadium (V), niobium (Nb), tantalum (Ta), chromium (Cr), molybdenum (Mo), tungsten (W), manganese (Mn), rhenium (Re), iron (Fe), cobalt (Co), nickel (Ni), copper (Cu), silver (Ag), gold (Au), palladium (Pd), platinum (Pt), rhodium (Rh), iridium (Ir), ruthenium (Ru) and osmium (Os). The metal carbide layers can additionally include one or more metals and/or metalloids selected from Group 13, such as aluminum (Al) and boron (B). By way of particular examples, one or more of the metal carbide layers include TiAlC, TaAlC, and/or NbAlC. The films can also include other elements, such as nitrogen, and/or hydrogen, as well as other elements, which can be, for example, incorporated into the film during deposition.

The films can be deposited using, for example, atomic layer deposition (ALD). In this case, the films can be formed by alternately exposing a substrate surface to sequential pulses of precursors. For example, a first metal carbide film can be formed by exposing the substrate surface to a first precursor, removing unreacted first precursor, exposing the substrate surface to a second precursor, and removing unreacted second precursor. Similarly, a second metal carbide film can be formed by exposing the substrate surface to a third precursor, removing unreacted third precursor, exposing the substrate surface to a fourth precursor, and removing unreacted fourth precursor. Excess precursor(s) and reaction byproducts (if any) are removed from the reaction space, e.g., by purging with an inert gas and/or with the aid of a vacuum generated by a pumping system. These steps can be repeated to form a desired number of first and second layers. Additionally or alternatively, other metal carbide layers can be formed—e.g., using a method as described herein.

Exemplary methods described herein can be performed in a reaction chamber having a substrate temperature of less than 500° C. or between about 300° C. to about 400° C.

In accordance with some exemplary embodiments of the disclosure, a method of forming a thin-film structure includes providing a substrate, depositing a first metal carbide layer using a first precursor and a second precursor, and depositing a second metal carbide layer using a third precursor and a fourth precursor. In accordance with various aspects of these embodiments, at least one of the third precursor and the fourth precursor differs from both the first precursor and the second precursor. By using at least one different precursor in the steps of depositing the first metal carbide layer and the second metal carbide layer, metal carbide layers having different properties and/or a mixture of metal carbide layers having desired properties can be obtained.

The first precursor can include, for example, one or more metal halides, such as one or more Group 3 to Group 12 metal halides, such as metal bromides, metal chlorides, and/or metal iodides. By way of examples, the first precursor can include one or more of titanium chloride (TiCl$_4$), tantalum chloride TaCl$_5$, and hafnium chloride (HfCl$_4$). When the first precursor includes two or more of such compounds, the compounds can be delivered to a reaction chamber at the same time or in separate pulses.

The second precursor can include one or more carbon-contributing compounds, such as organometallic compounds—e.g., aluminum hydrocarbon compounds. The aluminum hydrocarbon compound can be, for example, an alkane, alkene or alkyne. By way of examples, the aluminum hydrocarbon compound is selected from one or more of the group consisting of trimethylaluminum (TMA), triethylaluminum (TEA), dimethylaluminum hydride (DMAH), dimethylethylaminealane (DMEAA), trimethylaminealane (TEAA), N-methylpyrroridinealane (MPA), tri-isobutylaluminum (TIBA), and tritertbutylaluminum (TTBA). When the second precursor includes two or more of such compounds, the compounds can be delivered to a reaction chamber at the same time or in separate pulses.

In accordance with various aspects of these embodiments, the second and/or fourth precursor includes at least one C4-ligand, such as a C4-alkyl ligand like tertbutyl. In accordance with some aspects, the second and/or fourth precursor includes an alane, aminealane or aluminum hydride compound or a derivative thereof. In some embodiments the second and/or fourth precursor includes an alkyl or alkenyl compound, such as an aluminum allyl compound, an alkylaminealane or alkyl aluminum hydride compound or a derivative thereof. In accordance with yet further aspects, the second and/or fourth precursor includes an alkyl or alkenyl aluminum compound with one or more C3-C7 ligands or C4-05 ligands, such as butyl or pentyl ligands or derivatives thereof, for example, 2-methylbutylligands.

The second and/or fourth precursor, e.g., aluminum hydrocarbon compound, can be selected to achieve desired characteristics in the metal carbide film. The characteristic include, without limitation, adhesion, resistivity, oxidation resistance and work function. In addition, by selecting an appropriate aluminum hydrocarbon or other compound and appropriate deposition conditions, the level of aluminum in the metal carbide film can be controlled. For example, to achieve a higher aluminum concentration in a particular film, TEA may be selected over TMA. In some embodiments, different aluminum hydrocarbon compounds may be used in different ALD deposition cycles to modify the aluminum incorporation in the metal carbide film. For example, in a deposition process to deposit a metal carbide layer, a first ALD cycle can use a first aluminum compound and one or more ALD cycles can use a different aluminum compound.

The third precursor includes one or more of the first precursor compounds, and can be the same as the first precursor. For example, the third precursor can include one or more of titanium chloride (TiCl$_4$), tantalum chloride TaCl$_5$, and hafnium chloride (HfCl$_4$).

In accordance with exemplary embodiments of the disclosure, the fourth precursor differs from the second precursor. For example, the second precursor can be selected from one or more of the group consisting of trimethylaluminum (TMA), triethylaluminum (TEA), dimethylaluminum hydride (DMAH), dimethylethylaminealane (DMEAA), trimethylaminealane (TEAA), N-methylpyrroridinealane (MPA), tri-isobutylaluminum (TIBA), and tritertbutylaluminum (TTBA) the fourth precursor can be another one of these compounds.

By way of examples, metal carbide films formed using $TiCl_4$ and TEA can yield crystallites embedded within $Al_4C_3$ amorphous films. Such films have relatively high resistivity (e.g., about 2-3 uohm*cm), are relatively oxidation resistant (thought to be due to the $Al_4C_3$), and structures including such films exhibit relatively low leakage current. In contrast, metal carbide films formed using $TiCl_4$ and TTBA much lower resistivity, are oxidation resistant, and structures including such films exhibit relatively high (e.g., 10× higher compared to metal carbide films formed using $TiCl_4$ and TEA) leakage currents.

As noted above, a purge gas can be used to evacuate the first precursor or the second precursor prior to introducing the another precursor. Exemplary purge gasses include inert gasses, such as argon (Ar) and helium (He), and nitrogen ($N_2$).

Additional reactants can also be included during a deposition process to, for example, reduce the deposited film or to incorporate a further species in the film. In some embodiments an additional reactant can be a reducing agent, such as plasma-excited species of hydrogen generated by, e.g., an in situ or remote plasma generator. The reducing agent can be pulsed to the reaction space (or generated in the reaction space) after the first and/or the second precursor is introduced in to the reaction chamber to reduce the deposited film. The reducing agent can be used, for example, to remove impurities, such as halogen atoms or oxidizing material (e.g., oxygen atoms) in the film and/or the substrate. The reducing agent can also be used to control the incorporation of aluminum into the metal carbide film, thereby controlling the properties of the film. In some embodiments, thermal ALD and plasma ALD cycles are used in the same deposition process to control aluminum concentration in the deposited film. The ratio of thermal ALD cycles to plasma ALD cycles can be selected to achieve the desired aluminum concentration and/or concentration profile in the thin film.

In accordance with further exemplary embodiments of the disclosure, nitrogen can be introduced into a reaction chamber during a first process and/or a second process to incorporate nitrogen into one or more layers. In these cases, nitrogen can flow continuously to a reaction space during the entire deposition cycle, or the nitrogen can be present in the reaction space during all or part of the time that the first and/or second precursors are present in the reaction chamber. For example, in accordance with some examples, a carrier gas comprising nitrogen can be used to provide the first and/or second precursors. Additionally or alternatively, the nitrogen can be introduced into the reaction space through a gas flow separate from the one of or both of the first and second precursors.

In accordance some examples, nitrogen flows into a reaction space throughout a deposition cycle, described in more detail below, and aids in the removal of excess first and/or second precursor and reaction byproducts, if any, from the reaction space. In some examples, excess first precursor can be removed from the reaction space by continuing to flow nitrogen into the reaction space without providing the first precursor. Additionally, excess second precursor can be removed from the reaction space by continuing to flow nitrogen into the reaction space without providing the second precursor.

The nitrogen can be derived from a single nitrogen precursor. Or, the nitrogen can be derived from two or more nitrogen precursors. Nitrogen precursors can include a primary nitrogen precursor and one or more additional nitrogen sources; for example, nitrogen can be present as contaminants or minor components of one or more precursors. In some examples, a nitrogen precursor comprises, consists of, or consists essentially of molecular nitrogen. In some cases the nitrogen precursor can be selected from one or more of $N_2$, $NH_3$, hydrazine, and hydrazine derivatives thereof.

When used, plasma parameters can be selected or manipulated to modify the level of incorporation of aluminum into the metal carbide film and/or ratio of one or more metals to carbon. That is, in some embodiments, film composition can be controlled as a function of plasma parameters. In addition to composition, other film characteristics such as crystallinity, crystal lattice constant, resistivity and crystal stress can be adjusted by selecting and/or adjusting appropriate plasma parameters.

"Plasma parameters" include, for example, RF power and RF frequency. One plasma parameter, such as RF power, or multiple plasma parameters, i.e., a set of plasma parameters, such as RF power and RF frequency can be adjusted in one or more ALD cycles to achieve the desired film properties. Plasma parameters can be selected to yield a metal carbide film with a desired composition. As an example, the RF power may be selected to affect a stoichiometry as desired. As another example, a particular plasma pulse duration or RF power on time can be used to obtain a desired composition. As still another example, the desired composition can be achieved by selecting a combination of RF power, reactant pulse duration, and reactant flow rate.

In some cases plasma parameters are selected to form one or more metal carbide layers of a gate electrode to yield a desired structure work function. Further, the plasma can be used to form one metal carbide layer in a structure and not used or used with different plasma parameter settings to form another metal carbide layer within the structure.

In some cases, plasma-excited species comprise hydrogen. Plasma-excited species of hydrogen include, without limitation, hydrogen radicals (H*) and hydrogen cations (e.g., H+, $H_2$+). Plasma-excited species of hydrogen can be formed in situ or remotely, for example, from molecular hydrogen ($H_2$) or hydrogen-containing compounds (e.g., silane, diborane, and the like).

Relationships between deposition parameters, such as plasma, precursors, etc. and thin film composition can be established by selecting parameter(s) and depositing a metal carbide film by a particular atomic layer deposition process using the selected parameter(s) until a film of desired thickness is formed. The film composition and characteristics can then be determined and another metal carbide film can be deposited using different parameters and/or having different properties. This process can be repeated for different parameters to develop relationships between the parameters and film composition. By selecting appropriate reaction conditions, a compound film with a composition as desired can be formed.

The ALD processes described herein can include one or more deposition cycles, wherein each deposition cycle includes:
1. providing a first precursor (e.g., one or more metal halide compounds) to a reaction space;
2. purging and/or evacuating excess first precursor and reaction byproducts;

3. providing a second precursor (e.g., one or more organometallic compounds, such as aluminum hydrocarbon compounds) to the reaction space; and
4. purging and/or evacuating excess second precursor and reaction byproducts from the reaction space.

Steps 1-4 can be referred to as an ALD cycle. Steps 1-4 can be repeated as desired using a first and/or second process to produce a metal carbide film of desired thickness and with a desired aluminum concentration. For example, steps 1-4 can be repeated up to 10, 100 or even 1000 or more times to produce metal carbide layers with, e.g., uniform thicknesses, and ranging from one or several atomic layers to 100 nanometers (nm) or more. In some embodiments, steps 1-4 can be repeated until a metal carbide film is formed with a thickness of from about 1 to about 1000 Å, less than about 1000 Å, or less than about 500 Å. In some embodiments the film has a thickness of less than about 300 Å, and in other embodiments less than about 200 Å. In one embodiment, the thickness is between about 100 Å and about 200 Å. In other embodiments the thickness is from about 20 to about 200 Å. One can appreciate that a thickness of the metal carbide film can vary depending on the particular application. As an example, for NMOS gate applications, the thickness is typically from about 50 Å to about 500 Å. As another example, for MIM capacitor applications (e.g., DRAM, eDRAM, etc.) the thickness range is typically from about 50 Å to about 200 Å. Further, for applications in which the metal carbide thin film serves to set the work function in a flash memory, the thickness is, for example, between about 20 Å and about 200 Å.

In some embodiments, steps 1 and 2 are repeated a predetermined number of times prior to steps 3 and 4. For example, steps 1 and 2 may be repeated five times prior to steps 3 and 4. As another example, steps 1 and 2 may be repeated ten times prior to steps 3 and 4. It should be understood that if a metal carbide film with compositional uniformity is desired, the number of times steps 1 and 2 are repeated should not exceed that which will prevent substantial carburization of the metal film. In one embodiment, the metal compound has a low decomposition temperature and the number of times steps 1 and 2 are repeated does not exceed one.

As noted above, in accordance with exemplary embodiments of the disclosure, a method of forming a thin-film structure includes depositing a first metal carbide layer using a first precursor and a second precursor and depositing a second metal carbide layer using a third precursor and a fourth precursor. In these cases, an exemplary ALD cycle includes:

A first process that includes:
1. providing a first precursor (e.g., one or more metal compounds) to the reaction space;
2. purging and/or evacuating excess first precursor and reaction byproducts;
3. providing a second precursor (e.g., one or more first aluminum hydrocarbon compounds) to the reaction space; and
4. purging and/or evacuating excess second precursor and reaction byproducts from the reaction space.

A second process that includes:
5. providing a third precursor (which can be the same as the first precursor) to the reaction space;
6. purging and/or evacuating excess third precursor and reaction byproducts;
7. providing a fourth precursor (e.g., an aluminum hydrocarbon compound that is different than the first precursor) to the reaction space; and
8. purging and/or evacuating excess fourth precursor and reaction byproducts from the reaction space.

The first and second processes can be repeated a desired number of times and need not be consecutive and the ratio of first cycles to second cycles can be selected to achieve the desired composition. Further, although described in connection with the first precursor including one or more metal compounds, the process steps could be reversed, with the first process including the one or more first aluminum hydrocarbon compounds followed by providing a metal compound). By way of examples, the first and third precursors comprise a metal halide, the second precursor includes an organometallic compound—e.g., an aluminum hydrocarbon compound selected from the group consisting of one or more of the group consisting of trimethylaluminum (TMA), triethylaluminum (TEA), dimethylaluminum hydride (DMAH), dimethylethylaminealane (DMEAA), trimethylaminealane (TEAA), N-methylpyrroridinealane (MPA), and tri-isobutylaluminum (TIBA) and the fourth precursor comprises an aluminum hydrocarbon compound selected from the group comprising, and consisting of tritertbutylaluminum (TTBA) or another organometallic compound listed above that is different from the second precursor. As noted above, exemplary methods can also include use of one or more plasma-excited species that can be introduced to the reaction chamber during or between steps.

The following general conditions apply to any of the deposition cycles disclosed herein. The reaction temperature can range from about 150° C. to about 550° C., about 300° C. to about 400° C., or about 350° C. to 375° C. A reaction chamber pressure can be from about 0.5 to about 10 torr, or about 2 to about 7 torr. The pressure can be adjusted to achieve a desirable growth rate and acceptable uniformity.

A first and/or third precursor (e.g., metal reactant) pulse time can be from about 0.1 to about 20 seconds or about 1 to about 10 seconds. A second and/or fourth precursor (e.g., aluminum hydrocarbon compound) pulse time can be from about 0.1 to about 20 seconds or from about 0.5 to about 2 seconds.

Purge times are generally from about 0.1 to about 10 seconds, or about 2 to about 8 seconds. In some embodiments a purge time of about 6 seconds is used. However, in other embodiments longer purge times may be used. In some embodiments purge times are the same for purging the first, second, third, and/or fourth precursor, while in other embodiments the purge times are different for the different precursors.

Flow rates are generally from about 100 to about 400 sccm for the inert purge gas, such as Ar. The carrier flow for both the first and second precursor can be about 100 to about 400 sccm. The carrier gas is preferably an inert gas, such as Ar, and may be the same as or different from the purge gas. The flow rates of the purge and carrier gases can be determined based, in part, on the particular reactor.

The ALD steps can be performed in any suitable ALD reactor, such as a showerhead ALD reactor—e.g., an EmerALD® reactor available from ASM America. Further, all or some of the steps described herein can be performed without an air or vacuum break. Further, as is generally understood, ALD processes as described herein can include chemical vapor deposition reaction—in other words, the reactions may not be "pure" ALD reactions.

Referring now to the figures, exemplary structures including metal carbide material are illustrated. FIG. 1 illustrates a structure 100 including a substrate 102, a dielectric layer 104, a layer (e.g., an etch stop layer) 106, and metal carbide material 112 including a first metal carbide layer 108 and a second metal carbide layer 110.

Substrate 102 can include any material having a surface onto which a layer can be deposited. Substrate 102 can include a bulk material such as silicon (e.g., single crystal silicon), and may include one or more layers overlying the bulk material. Further, the substrate can include various features, such as trenches, vias, lines, and the like formed within or on at least a portion of the substrate. The features can have an aspect ratio, defined as a feature's height divided by the feature's width, of, for example, greater than or equal to 5, greater than or equal to 10, greater than or equal to 15, or greater than or equal to 20.

Dielectric layer 104 can include, for example, high dielectric constant (high-k) material. Exemplary dielectric materials suitable for layer 104, include silicon oxide, silicon nitride, and high dielectric constant materials. In this context, high-k dielectric material has a dielectric constant (k) value greater than that of silicon oxide. For example, the high-k material can have a dielectric constant greater than 5, or greater than 10. Exemplary high-k materials include, without limitation, $HfO_2$, $ZrO_2$, $Al_2O_3$, $TiO_2$, $Ta_2O_5$, $Sc_2O_3$, lanthanideoxides and mixtures thereof, silicates and materials such as YSZ (yttria-stabilized zirconia), barium strontium titanate (BST), strontium titanate (ST), strontium bismuth tantalate (SBT) and bismuth tantalate (BT). The high-k dielectric material can be deposited by an ALD process.

Layer 106 can include, for example, TiN, which can be deposited over the dielectric layer. Layer 106 can act as an etch stop layer, barrier layer, or the like.

First and second metal carbide layers 108 and 110 can be formed as described above. First and second metal carbide layers 108 and 110 can be formed using different processes, such the composition and/or properties of the two layers differs. By way of examples, first metal carbide layer 108 can be formed using a metal halide precursor and an first organometallic precursor and second metal halide layer 110 can be formed using the metal halide and a second organometallic precursor. As noted above, although separately illustrated, first metal carbide layer 108 and second metal carbide layer 110 can mix either during or after deposition of second metal carbide layer 110. Further, first and/or second metal carbide layer can be continuous or discontinuous.

Figure 2:
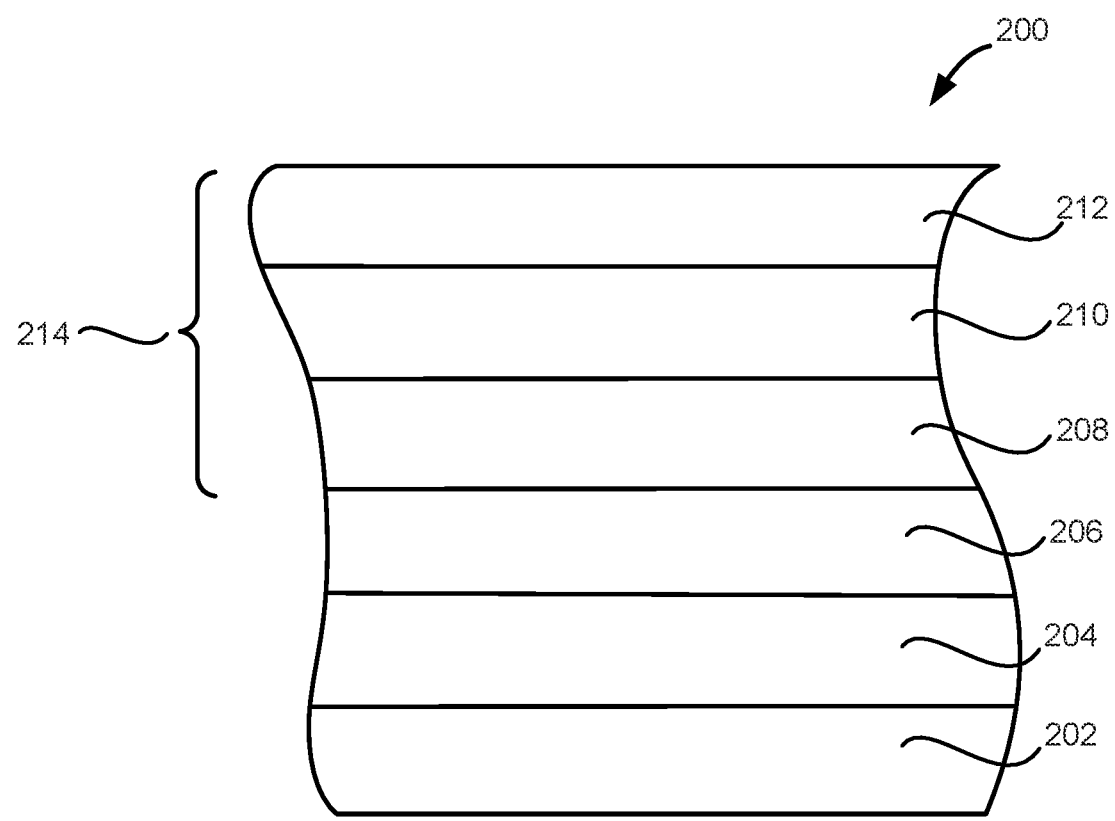
FIG. 2 illustrates another structure in accordance with additional exemplary embodiments of the disclosure.

FIG. 2 illustrates another structure 200 in accordance with exemplary embodiments of the disclosure. Structure 200 includes a substrate 202, a dielectric layer 204, a layer 206, and metal carbide material 214 that includes a first metal carbide layer 208, a second metal carbide layer 210, and a third metal carbide layer 212. Substrate 202, dielectric layer 204, and layer 206 can be the same or similar to substrate 102, dielectric layer 104, and layer 106. In the illustrated example, metal carbide material 214 includes three layers. In accordance with exemplary embodiments of the disclosure, adjacent layers of metal carbide material 214 are different— e.g., are formed by different processes and/or have different compositions. By way of examples, first metal carbide layer 208 can include a first transition metal (e.g., titanium), carbon, and aluminum; second metal carbide layer 210 can include a second transition metal (e.g., niobium), carbon, and aluminum, and third metal carbide layer 212 can include the first transition metal, carbon, and aluminum. The first, second, and third metal carbide layers can be discrete layers or two or more of the layers can be mixed. Further, each layer can be continuous or discontinuous. Additionally, although illustrated with three metal carbide layers, metal carbide material 214 and/or structure 200 can include additional metal carbide layers, as well as other layers found in similar structures.

Figure 3:
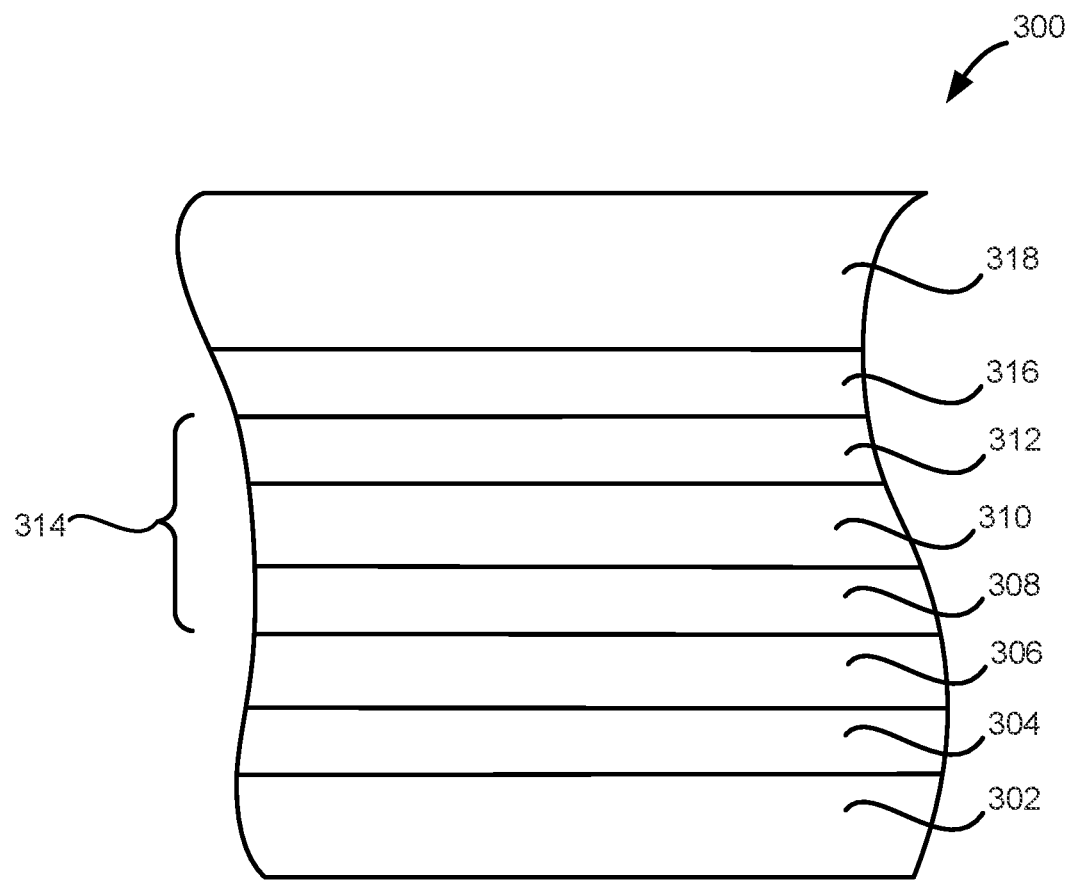
FIG. 3 illustrates yet another structure in accordance with additional exemplary embodiments of the disclosure.

FIG. 3 illustrates yet another structure 300 in accordance with further exemplary embodiments of the disclosure. Structure 300 includes a substrate 302, a dielectric layer 304, a layer 306, metal carbide material 314, including a first metal carbide layer 308, a second metal carbide layer 310, and a third metal carbide layer 312, an additional layer 316, and a metal layer 318. Substrate 302, dielectric layer 304, layer 306, metal carbide material 314, including first metal carbide layer 308, second metal carbide layer 310, and third metal carbide layer 312, can be the same or similar to the respective layers illustrated in FIG. 2. The first, second, and third metal carbide layers can be discrete layers or two or more of the layers can be mixed. Further, each layer can be continuous or discontinuous. Additionally, although illustrated with three metal carbide layers, metal carbide material 214 and/or structure 200 can include additional metal carbide layers, or other layers.

Additional layer 316 can be the same or similar to layer 306. Metal layer 318 can include any suitable metal, such as tungsten (W).

Figure 4:
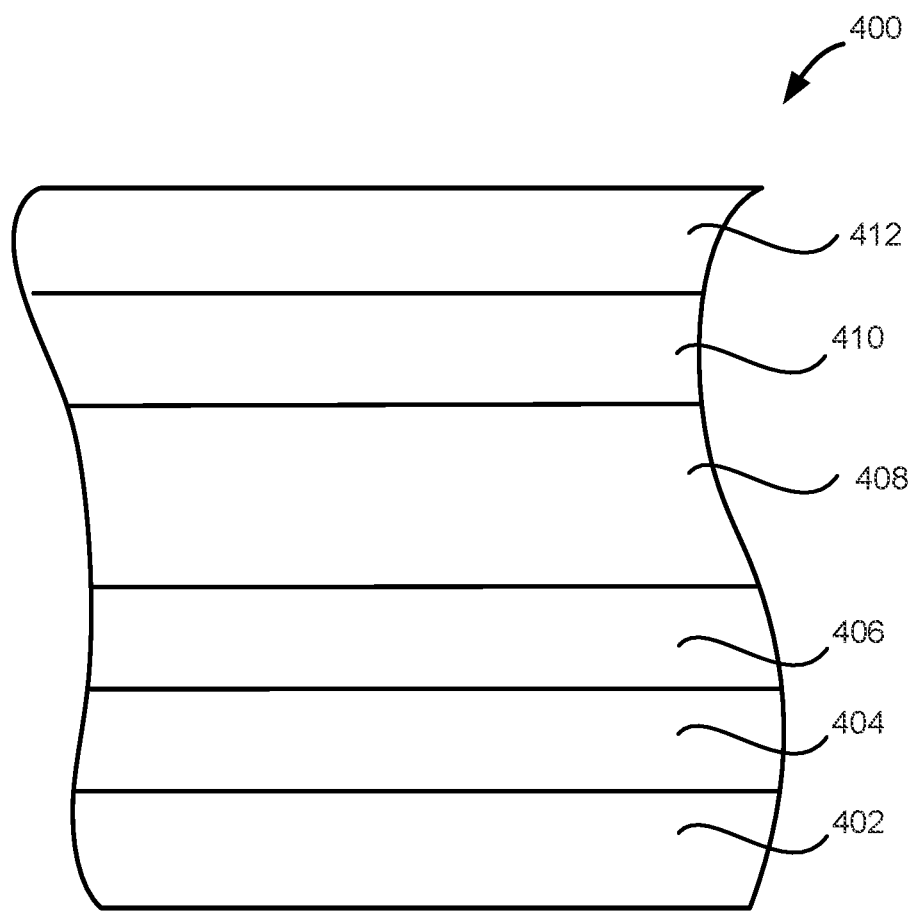
FIG. 4 illustrates another structure in accordance with additional exemplary embodiments of the disclosure.

FIG. 4 illustrates another structure 400 in accordance with exemplary embodiments of the disclosure. Structure 400 includes a substrate 402, a dielectric layer 404, a layer 406, metal carbide material 408, an additional layer 410, and a metal layer 412. Substrate 402, dielectric layer 404, layer 406, metal carbide material 404, additional layer 410, and metal layer 412 can be the same or similar to the respective layers described above in connections with FIGS. 1-3. For example, metal carbide material 404 can include the metal carbide layers illustrated in any of FIGS. 1-3.

Figure 5:
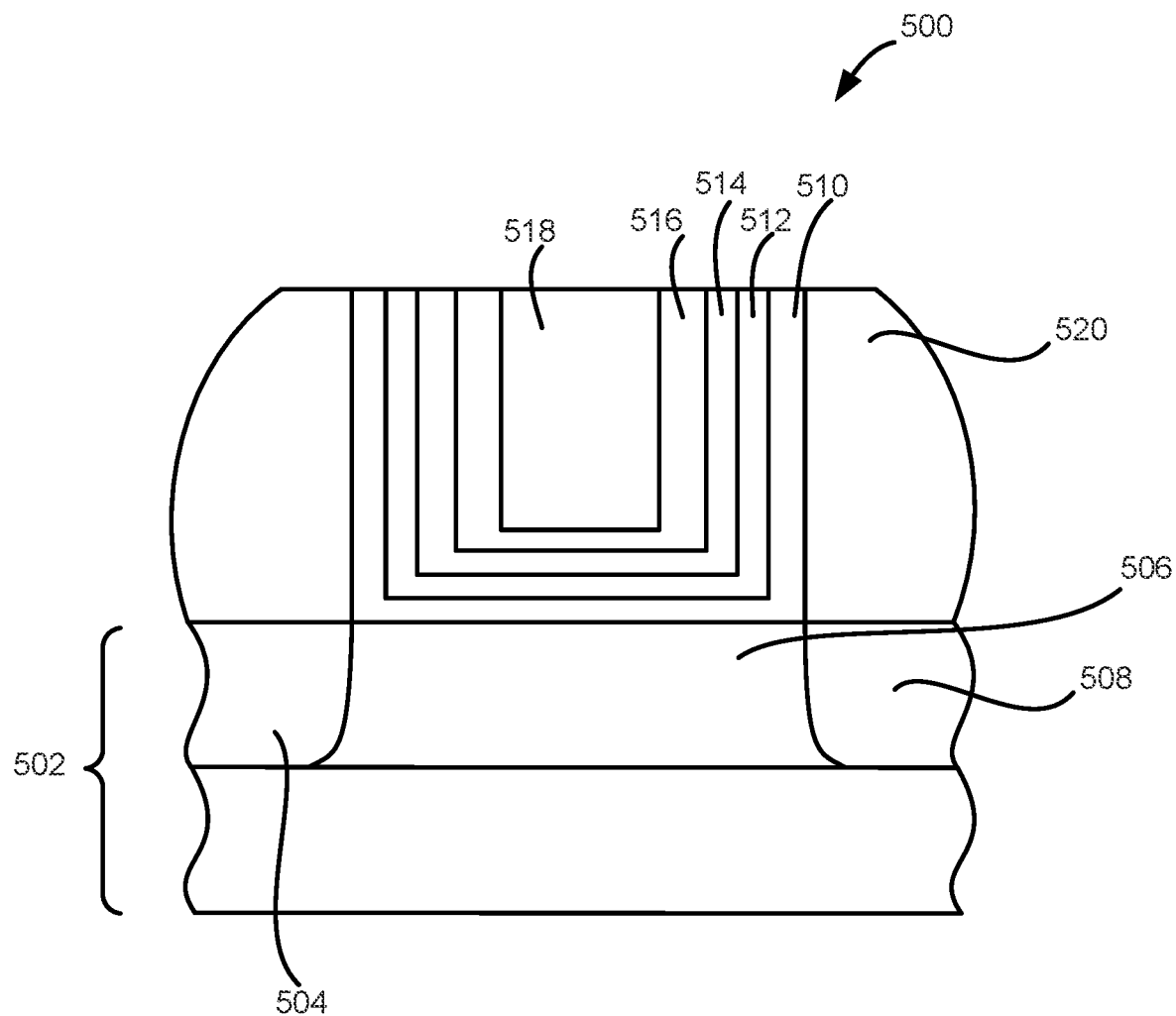
FIG. 5 illustrates a device in accordance with exemplary embodiments of the disclosure.

FIG. 5 illustrates a device 500 in accordance with various embodiments of the disclosure. Other devices within the scope of the disclosure can include other structures, such as the structures described herein. In the illustrated example, device 500 includes a substrate 502, having a source region 504, a drain region 508, and a channel region 506 therebetween.

Device 500 also includes a dielectric layer 510, a layer 512, metal carbide material 514, optionally an additional layer 516, and optionally metal layer 518. Dielectric layer 510, layer 512, metal carbide material 514, additional layer 516, and metal layer 518 can be the same or similar to the respective layers described above in connection with structures 100-400.

Device 500 can be configured as either an NMOS or a PMOS device and can form part of a CMOS device. A work function of device 500 can be tuned as described herein to facilitate formation of NMOS and CMOS devices.

By way of particular example, a structure can be formed using a first process to form a first layer, a second process to form a second layer, and the first process to form a third layer. The first process can include using ALD to deposit a TiAlC film using $TiCl_4$ and TEA as precursors. The second process can include using ALD to deposit another TiAlC film using $TiCl_4$ and TTBA as precursors. Reactor conditions for the ALD processes can be: reaction chamber pressure of about 1 Torr and a susceptor/substrate temperature of about 400° C. An exemplary thickness of the first layer can be about 5 Å, an exemplary thickness of the second layer can be about 20 Å, and an exemplary thickness of the third layer can be about 5 Å. In this case, a film stack having relatively low resistance and relatively low leakage is obtained. The first layer is thought to reduce leakage current, because it has less or no "free" aluminum. The middle/ second layer has lower resistivity—thought to be due to the "free" aluminum. The third layer acts as a cap.

It is to be understood that the configurations and/or approaches described herein are exemplary in nature, and that these specific embodiments or examples are not to be considered in a limiting sense. In the case of exemplary methods, specific routines or steps described herein can represent one or more of any number of processing strategies. Thus, the various acts illustrated can be performed in the sequence illustrated, performed in other sequences, performed simultaneously, or omitted in some cases.

The subject matter of the present disclosure includes all novel and nonobvious combinations and subcombinations of the various processes, layers, structures and devices, and other features, functions, acts, and/or properties disclosed herein, as well as any and all equivalents thereof.

What is claimed is:

1. A thin-film structure, comprising:
   a substrate;
   a first metal carbide material; and
   a second metal carbide material,
   wherein one of the first metal carbide material and the second metal carbide material comprises crystallites embedded within an amorphous film, and
   wherein the other of the first metal carbide material and the second metal carbide material has a lower resistivity than the first metal carbide material or the second metal carbide material that comprises the crystallites embedded within the amorphous film.

2. The structure of claim 1, wherein the first metal carbide is disposed overlying the substrate.

3. The structure of claim 2, wherein the second metal carbide material is disposed overlying the first metal carbide material.

4. The structure of claim 1, wherein the other of the first metal carbide material and the second metal carbide material exhibits a greater leakage current than the first metal carbide material or the second metal carbide material that comprises the crystallites embedded within the amorphous film.

5. The structure of claim 1, wherein the first metal carbide material includes a first transition metal, carbon and aluminum, and wherein the second metal carbide material includes a second transition metal, carbon and aluminum.

6. The structure of claim 5, wherein the second transition metal comprises niobium (Nb).

7. The structure of claim 1, further comprising a dielectric layer disposed at least one of between the substrate and the first metal carbide material or between the first metal carbide material and the second metal carbide material, wherein the dielectric layer comprises at least one of zirconium dioxide ($ZrO_2$), aluminum oxide ($Al_2O_3$), titanium dioxide ($TiO_2$), tantalum pentoxide ($Ta_2O_5$), scandium oxide ($Sc_2O_3$), lanthanideoxides and mixtures thereof, silicates, YSZ (yttria-stabilized zirconia), barium strontium titanate (BST), strontium titanate (ST), strontium bismuth tantalate (SBT), or bismuth tantalate (BT).

8. A thin-film system configured to be disposed on a substrate, comprising:
   a first metal carbide material; and
   a second metal carbide material,
   wherein one of the first metal carbide material and the second metal carbide material comprises crystallites embedded within an amorphous film.

9. The system of claim 8, wherein the first metal carbide material is disposed overlying the substrate.

10. The system of claim 8, wherein the other of the first metal carbide material and the second metal carbide material has a lower resistivity than the first metal carbide material or the second metal carbide material that comprises the crystallites embedded within the amorphous film.

11. The system of claim 8, further comprising a dielectric layer disposed at least one of between the substrate and the first metal carbide material or between the first metal carbide material and the second metal carbide material, wherein the dielectric layer comprises at least one of zirconium dioxide ($ZrO_2$), aluminum oxide ($Al_2O_3$), titanium dioxide ($TiO_2$), tantalum pentoxide ($Ta_2O_5$), scandium oxide ($Sc_2O_3$), lanthanideoxides and mixtures thereof, silicates, YSZ (yttria-stabilized zirconia), barium strontium titanate (BST), strontium titanate (ST), strontium bismuth tantalate (SBT), or bismuth tantalate (BT).

12. The system of claim 9, wherein the second metal carbide material is disposed overlying the first metal carbide material.

13. The system of claim 8, wherein the first metal carbide material includes a first transition metal, carbon, and aluminum, and wherein the second metal carbide material includes a second transition metal, carbon, and aluminum.

* * * * *